(12) United States Patent
Xi et al.

(10) Patent No.: US 10,289,237 B2
(45) Date of Patent: May 14, 2019

(54) TOUCH-CONTROL PANEL WITH SWITCH CIRCUIT FOR DRIVING THE TOUCH-CONTROL ELECTRODES IN GROUPS FOR DISPLAY MODE AND TOUCH-CONTROL MODES, AND TOUCH-CONTROL DISPLAY DEVICE THEREOF

(71) Applicants: Shanghai AVIC OPTO Electronics Co., Ltd., Shanghai (CN); Tianma Micro-electronics Co., Ltd., Shenzhen (CN)

(72) Inventors: Kerui Xi, Shanghai (CN); Tingting Cui, Shanghai (CN)

(73) Assignees: Shanghai AVIC OPTO Electronics Co., Ltd., Shanghai (CN); Tianma Micro-electronics Co., Ltd., Shenzhen (CN)

( * ) Notice: Subject to any disclaimer, the term of this patent is extended or adjusted under 35 U.S.C. 154(b) by 27 days.

(21) Appl. No.: 15/268,286

(22) Filed: Sep. 16, 2016

(65) Prior Publication Data
US 2017/0003815 A1    Jan. 5, 2017

(30) Foreign Application Priority Data

Jul. 15, 2016  (CN) .......................... 2016 1 0556996

(51) Int. Cl.
*G06F 3/041* (2006.01)
*H01L 27/32* (2006.01)
(Continued)

(52) U.S. Cl.
CPC ........ *G06F 3/0416* (2013.01); *G02F 1/13338* (2013.01); *G06F 3/044* (2013.01);
(Continued)

(58) Field of Classification Search
CPC ......... G06F 3/0416; G06F 2203/04106; G06F 3/044; G06F 3/0412; H01L 27/3209;
(Continued)

(56) References Cited

U.S. PATENT DOCUMENTS 6,642,916 B1 * 11/2003 Kodama .............. G09G 3/3688
345/100
2010/0194695 A1 * 8/2010 Hotelling .............. G06F 3/0412
345/173

(Continued)

FOREIGN PATENT DOCUMENTS

CN          101887344 A     11/2010

*Primary Examiner* — Temesghen Ghebretinsae
*Assistant Examiner* — Ivelisse Martinez Quiles
(74) *Attorney, Agent, or Firm* — Anova Law Group, PLLC

(57) ABSTRACT

A touch-control panel and a touch-control display device are provided. The touch-control panel comprises a plurality of touch-control emitting electrodes arranged along a first direction, a plurality of touch-control receiving electrodes arranged along a second direction, and a touch-control driving circuit electrically with the plurality of touch-control emitting electrodes. The plurality of touch-control emitting electrodes are divided into a plurality of touch control emitting electrode groups along the first direction. The first direction crosses or intersects the second direction. In a first touch-control mode, the touch-control driving circuit is configured to electrically connect all touch-control emitting electrodes in a same touch-control emitting electrode group, and sequentially transit a touch-control detecting signal to the plurality of touch-control emitting electrode groups. In a second touch-control mode, the touch-control driving circuit is configured to sequentially transit the touch-control detecting signal to the plurality of touch-control emitting electrode.

16 Claims, 9 Drawing Sheets

(51) Int. Cl.
*H01L 25/04* (2014.01)
*G02F 1/1333* (2006.01)
*G06F 3/044* (2006.01)

(52) U.S. Cl.
CPC .. *G06F 3/0412* (2013.01); *G06F 2203/04106* (2013.01); *H01L 25/048* (2013.01); *H01L 27/3209* (2013.01)

(58) Field of Classification Search
CPC ............... H01L 25/048; G02F 1/13439; G02F 1/134309; G02F 1/1368; G02F 1/13338; G02F 1/133514; G02F 2001/136222; G02F 2201/121
See application file for complete search history.

(56) References Cited

U.S. PATENT DOCUMENTS

| | | | | |
|---|---|---|---|---|
| 2011/0279408 | A1* | 11/2011 | Urano | G06F 3/044 345/174 |
| 2012/0050216 | A1* | 3/2012 | Kremin | G06F 3/0416 345/174 |
| 2012/0262387 | A1* | 10/2012 | Mizuhashi | G06F 3/0412 345/173 |
| 2014/0152616 | A1* | 6/2014 | Kida | G06F 3/0418 345/174 |
| 2015/0062062 | A1* | 3/2015 | Han | G06F 3/0412 345/174 |
| 2015/0077387 | A1* | 3/2015 | Han | G06F 3/044 345/174 |
| 2017/0003807 | A1* | 1/2017 | Abe | G06F 3/0416 |
| 2017/0242513 | A1* | 8/2017 | Lin | G06F 3/0412 |

* cited by examiner

TOUCH-CONTROL PANEL WITH SWITCH CIRCUIT FOR DRIVING THE TOUCH-CONTROL ELECTRODES IN GROUPS FOR DISPLAY MODE AND TOUCH-CONTROL MODES, AND TOUCH-CONTROL DISPLAY DEVICE THEREOF

CROSS-REFERENCES TO RELATED APPLICATIONS

This application claims priority of Chinese Patent Application No. 201610556996.3, filed on Jul. 15, 2016, the entire contents of which are hereby incorporated by reference.

FIELD OF THE INVENTION

The present disclosure generally relates to the field of touch-control display technology and, more particularly, relates to a touch-control panel and a touch-control display device thereof.

BACKGROUND

Most current touch-control display devices are capacitive touch-control display devices, and the capacitive touch-control structures may be divided into self-capacitive touch-control structures and mutual capacitive touch-control structures. A current mutual capacitive touch-control structure often consists of a plurality of touch-control emitting electrodes and a plurality of touch-control sensing electrodes. The plurality of touch-control emitting electrodes and the plurality of touch-control sensing electrodes are segregated and disposed on different layers, and the touch-control emitting electrodes and the touch-control sensing electrodes are intersectedly arranged. Often, the touch-control emitting electrodes are arranged in a direction perpendicular to the touch-control sensing electrodes.

In current mutual capacitive touch-control display devices, since the width of the touch-control emitting electrodes is relatively large, the touch-control modes that may be realized by the current touch-control display devices are limited, and the application scope of the touch-control display devices is narrow. For example, some current touch-control display devices may only realize a finger touch-control mode, but not a high-precision touch-control mode (i.e., a stylus touch-control mode).

The disclosed touch-control panel and touch-control display device are directed to solve one or more problems set forth above and other problems.

BRIEF SUMMARY OF THE DISCLOSURE

One aspect of the present disclosure provides a touch-control panel. The touch-control panel comprises a plurality of touch-control emitting electrodes arranged along a first direction, a plurality of touch-control receiving electrodes arranged along a second direction, and a touch-control driving circuit electrically with the plurality of touch-control emitting electrodes. The first direction crosses or intersects the second direction. The plurality of touch-control emitting electrodes are divided into a plurality of touch control emitting electrode groups along the first direction. In a first touch-control mode, the touch-control driving circuit is configured to electrically connect all touch-control emitting electrodes in a same touch-control emitting electrode group, and sequentially transit a touch-control detecting signal to the plurality of touch-control emitting electrode groups. In a second touch-control mode, the touch-control driving circuit is configured to sequentially transit the touch-control detecting signal to the plurality of touch-control emitting electrode.

Another aspect of the present disclosure provides a touch-control display device. The touch-control display device includes a touch-control panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined or separated under conditions without conflicts.

As discussed above, instead of high-precision touch-control modes like stylus touch-control, current touch-control display devices may only realize the finger touch-control mode. To realize the high-precision touch control mode, a smaller width of the touch-control emitting electrodes may be desired, thus elongating the touch-control detection period and increasing the power consumption.

The present disclosure provides an improved touch-control panel and an improved touch-control display device. The disclosed touch-control display device may realize a first touch-control mode (i.e., finger touch-control mode) and a second touch-control mode (i.e., stylus touch-control mode), indicating increased touch-control modes in the touch-control display device, which broadens the application scope of the touch-control display device.

Figure 1:
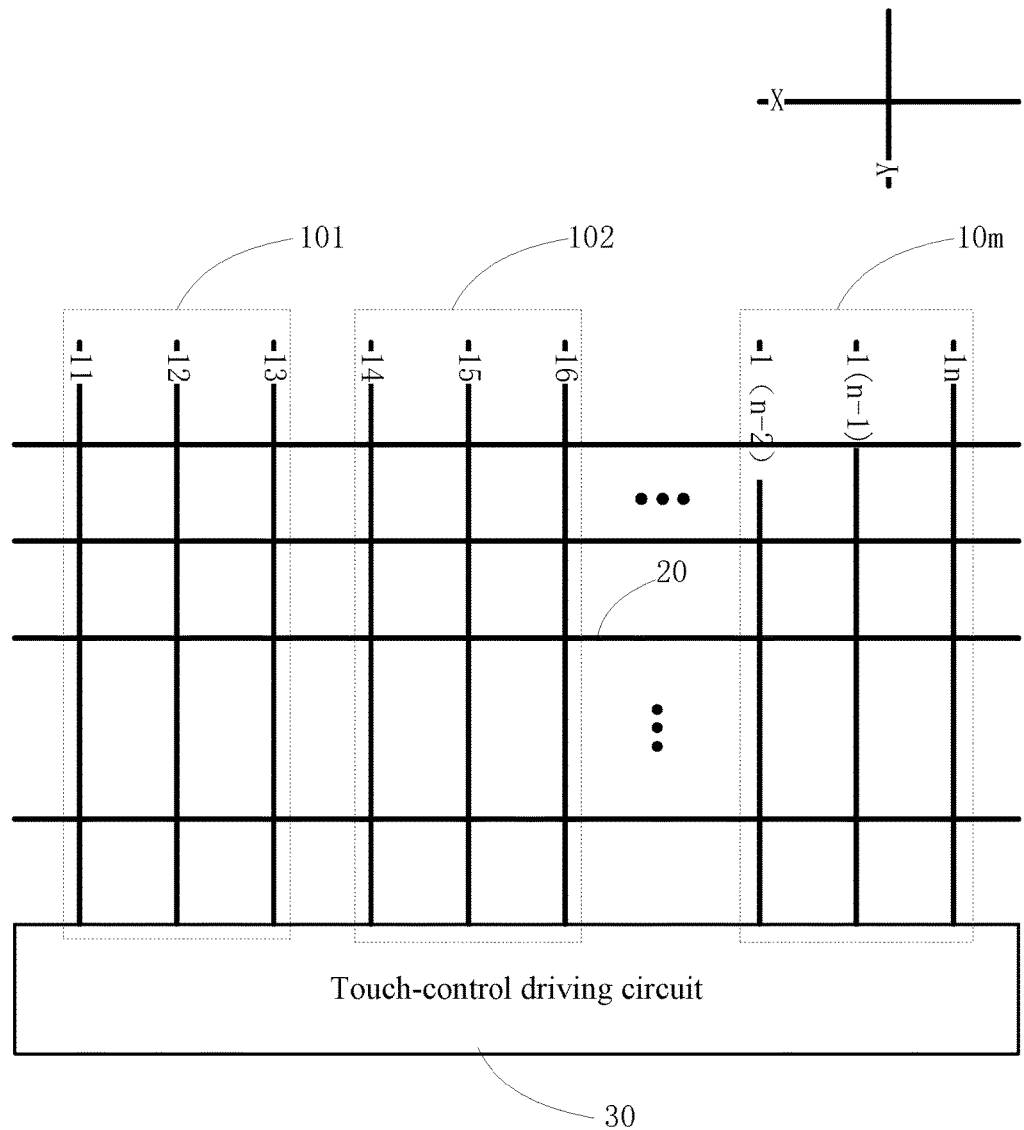
FIG. 1 illustrates an exemplary touch-control panel consistent with disclosed embodiments.

In one embodiment, FIG. 1 illustrates an exemplary touch-control panel. As shown in FIG. 1, a touch-control panel may include a plurality of touch-control emitting electrodes arranged along a first direction X, a plurality of touch-control receiving electrodes 20 arranged along a second direction Y, and a touch-control driving circuit 30. The first direction X may cross or intersect the second direction Y.

The plurality of touch-control emitting electrodes, from a first touch-control emitting electrode 11 to an 'nth' touch-control emitting electrode 1$n$, may be divided into a plurality of touch-control electrode groups, from a first touch-control emitting electrode group 101 to an 'mth' touch-control emitting electrode group 10$m$, and both 'n' and 'm' are integers larger than or equal to 2. Each touch-control emitting electrode group may include more than one touch-control emitting electrodes.

The touch-control driving circuit 30 may electrically connect the plurality of touch-control emitting electrodes, from the first touch-control emitting electrode 11 to the 'nth' touch-control emitting electrode 1$n$, respectively. In a first touch-control mode, the touch-control driving circuit 30 may electrically connect all touch-control emitting electrodes in a same touch-control emitting electrode group, and sequentially transit a touch-control detecting signal to the plurality of touch-control emitting electrode groups, from the first touch-control emitting electrode group 101 to the 'mth' touch-control emitting electrode group 10$m$.

Further, in a second touch-control mode, the touch-control driving circuit 30 may individually and sequentially transit the touch-control detecting signal to the plurality of touch-control emitting electrodes, from the first touch-control emitting electrode 11 to the 'nth' touch-control emitting electrode 1$n$.

For the disclosed touch-control panel, the numbers of touch-control emitting electrodes in each touch-control emitting electrode group are only for illustrative purpose, and are not intended to limit the scope of the present disclosure. The numbers of touch-control emitting electrodes in each touch-control emitting electrode group may be the same, and dimensions of the touch-control emitting electrode groups may be any appropriate dimensions for a first touch-control mode. For example, the dimensions of the disclosed touch-control emitting electrode groups may be compatible with the dimensions of existing touch-control emitting electrodes, and all touch-control emitting electrodes in one disclosed touch-control emitting electrode group may be equivalent to one existing touch-control emitting electrode.

For example, as shown in FIG. 1, each touch-control emitting electrode group may consist of three touch-control emitting electrodes. Specifically, the first touch-control emitting electrode group 101 may include the first touch-control emitting electrode 11, a second touch-control emitting electrode 12, and a third touch-control emitting electrode 13. A second touch-control emitting electrode group 102 may include a fourth touch-control emitting electrode 14, a fifth touch-control emitting electrode 15, and a sixth touch-control emitting electrode 16. Similarly, the m touch-control emitting electrode group 10$m$ may include an (n−2) touch-control emitting electrode 1($n$−2), an (n−1) touch-control emitting electrode 1($n$−1), and an n touch-control emitting electrode 1$n$. In some other embodiments, each touch-control emitting electrode group may include a different number of touch-control emitting electrodes, for example, 4 or 5.

In the first touch-control mode, namely, the finger touch-control mode, the touch-control driving circuit 30 may electrically connect all touch-control emitting electrodes in the same touch-control emitting electrode group, and sequentially transit the touch-control detecting signal to the plurality of touch-control emitting electrode groups, from the first touch-control emitting electrode group 101 to the 'mth' touch-control emitting electrode group 10$m$.

Further, the disclosed touch-control panel may also realize a high-precision touch-control mode, namely, the second touch-control mode. In the high-precision touch-control mode, the touch-control driving circuit 30 may segregate the plurality of touch-control emitting electrodes, from the first touch-control emitting electrode 11 to the 'nth' touch-control emitting electrode 1$n$, and sequentially transit the touch-control detecting signal to the plurality of touch-control emitting electrodes, from the first touch-control emitting electrode 11 to the 'nth' touch-control emitting electrode 1$n$. That is, in the high-precision touch-control mode, the touch-control driving circuit 30 may not drive the touch-control emitting electrodes in each touch-control emitting electrode group as a whole, and instead may drive the individual touch-control emitting electrodes.

Figure 2:
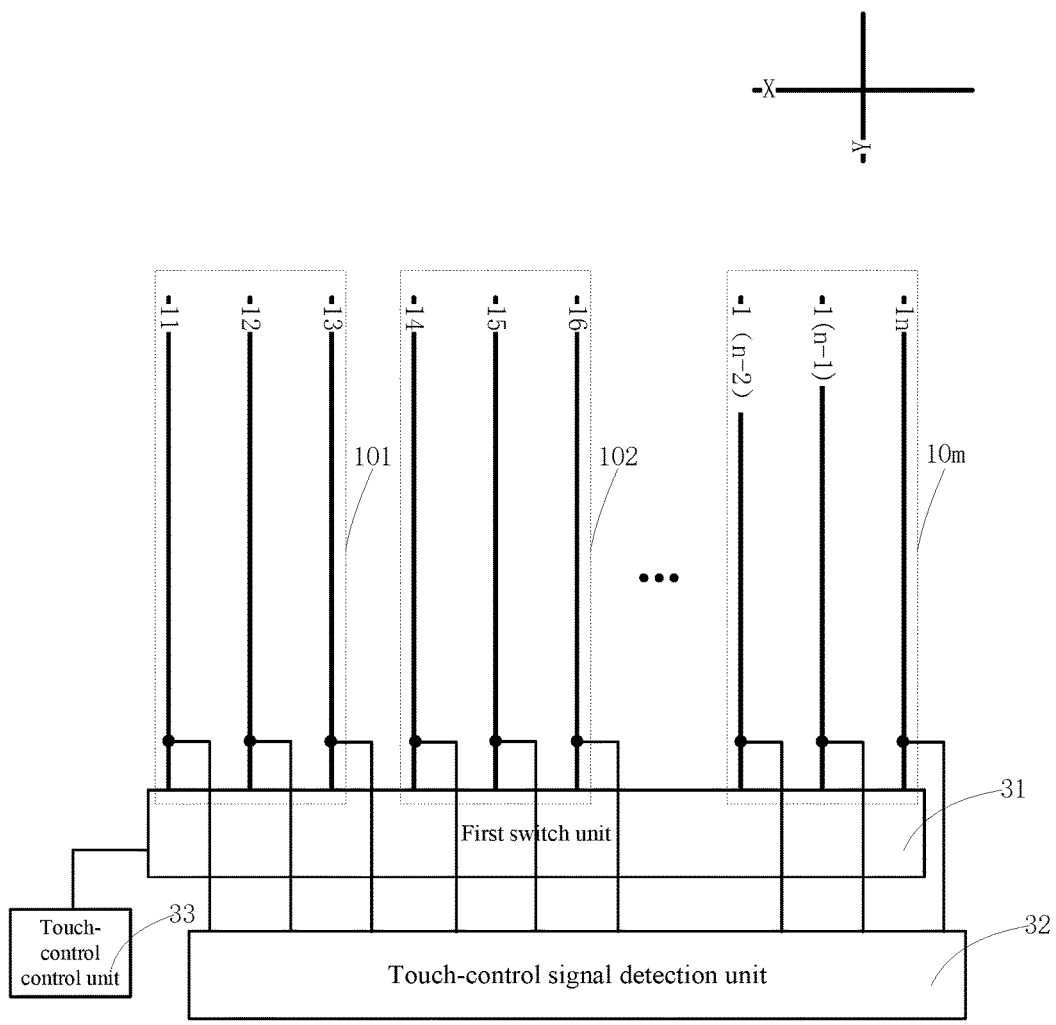
FIG. 2 illustrates another exemplary touch-control panel consistent with disclosed embodiments.

FIG. 2 illustrates another exemplary touch-control panel. As shown in FIG. 2, the touch-control driving circuit 30 may include a first switch unit 31, a touch-control signal detection unit 32, and a touch-control control unit 33.

Specifically, in the first touch-control mode, the first switch unit 31 may electrically connect all touch-control emitting electrodes in the same touch-control emitting electrode group under the control of the touch-control control unit 33. The touch-control signal detection unit 32 may sequentially transit the touch-control detecting signal to the plurality of touch-control emitting electrode groups, from the first touch-control emitting electrode group 101 to the 'mth' touch-control emitting electrode group 10$m$. That is, in the first touch-control mode, the touch-control emitting electrodes in one touch-control emitting electrode group may be connected together to form an equivalent touch-control emitting electrode, and the touch-control signal detection unit 32 may sequentially transit the touch-control detecting signal to each equivalent touch-control emitting electrode of a corresponding touch-control emitting electrode group.

In the second touch-control mode, the first switch unit 31 may segregate all touch-control emitting electrodes in the same touch-control emitting electrode group from each other under the control of the touch-control control unit 33. The touch-control driving circuit 30 may sequentially transit the touch-control detecting signal to the plurality of touch-control emitting electrodes, from the first touch-control emitting electrode 11 to the 'nth' touch-control emitting electrode 1$n$.

Further, in the first touch-control mode, each touch-control emitting electrode group may be treated as a whole to detect a touch-control location together with touch-control sensing electrodes. Accordingly, in the first touch-control mode, the touch-control control unit 33 may control the first switch unit 31 to electrically connect all the touch-control emitting electrodes in the same touch-control emitting electrode group, and the touch-control signal detection unit 32 may sequentially transit the touch-control detecting signal to all the touch-control emitting electrode groups.

Because in the first touch-control mode, all the touch-control emitting electrodes in the same touch-control emitting electrode group may be electrically connected, the touch-control signal detection unit 32 may only need to transit the touch-control detecting signal to at least one touch-control emitting electrode in the same touch-control emitting electrode group.

Further, in the second touch-control mode, namely, the high-precision touch-control mode, all touch-control emitting electrodes may need to individually cooperate with the touch-control sensing electrodes to detect the touch-control location. Accordingly, in the second touch-control mode, the touch-control control unit 33 may control the first switch unit 31 to segregate all touch-control emitting electrodes, and the touch-control signal detection unit 32 may sequentially transit the touch-control detecting signal to all the touch-control emitting electrodes.

Figure 3:
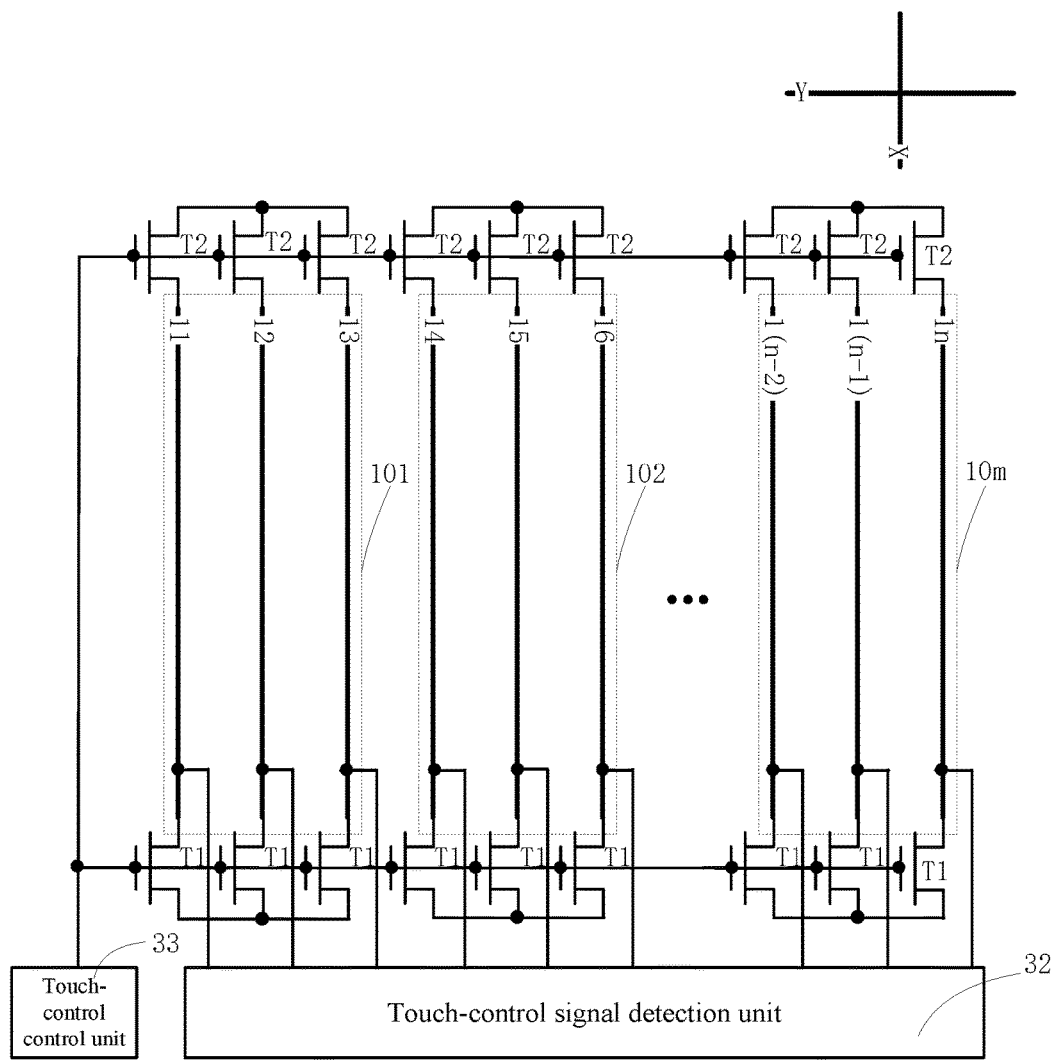
FIG. 3 illustrates an exemplary type of first switch unit consistent with disclosed embodiments.

FIG. 3 illustrates another exemplary type of first switch unit 31. As shown in FIG. 3, the first switch unit 31 may include a plurality of first controllable switches T1 and a plurality of second controllable switches T2. Each disclosed touch-control emitting electrode may correspond to one first controllable switch T1 and one second controllable switch T2. Specifically, a first end of each touch-control emitting electrode may be simultaneously and electrically connected with a second end of the first controllable switch T1 and the touch-control signal detection unit 32 through a connection node N1 on each touch-control emitting electrode, and the connection node N1 is adjacent to the second end of the respective first controllable switch T1, and a second end of each touch-control emitting electrode may be electrically connected with a first end of the second controllable switch T2. Control terminals of the first controllable switches T1 and control terminals of the second controllable switches T2 may all be electrically connected with the touch-control control unit 33.

First ends of all first controllable switches T1 corresponding to the touch-control emitting electrode groups may be electrically connected, and second ends of all second controllable switches T2 corresponding to the touch-control emitting electrode groups may be electrically connected.

Specifically, in the first touch-control mode, the touch-control control unit 33 may control the first controllable switches T1 and the second controllable switches T2 to be simultaneously on, thus electrically connecting all the touch-control emitting electrodes in the same touch-control emitting electrode group. Further, the touch-control signal detection unit 32 may sequentially transit the touch-control detecting signal to the plurality of touch-control emitting electrode groups, from the first touch-control emitting electrode group 101 to the 'mth' touch-control emitting electrode group 10m.

In the second touch-control mode, the touch-control unit 32 may control the first controllable switches T1 and the second controllable switches T2 to be simultaneously off, thus segregating all touch-control emitting electrodes. Further, the touch-control signal detection unit 32 may sequentially transit the touch-control detecting signal to the plurality of touch-control emitting electrodes, from the first touch-control emitting electrode 11 to the 'nth' touch-control emitting electrode 1n.

The first controllable switches T1 and the second controllable switches T2 may be thin film transistors (TFTs). The first controllable switches T1 and the second controllable switches T2 may have a same conduction type to reduce the number of output terminals in the touch-control control unit 33, making it convenient to construct circuit lines.

In some other embodiments, the first controllable switches T1 and the second controllable switches T2 may be transistors with different conduction types as long as in the first touch-control mode, the first and second controllable switches may be controlled by the touch-control control unit to be simultaneously on, and in the second touch-control mode, the first and second controllable switches may be controlled by the touch-control control unit to be simultaneously off.

In a display stage, the disclosed touch-control panel may need to maintain a signal in the touch-control emitting electrode as a reference signal or a data signal. Further, in the disclosed touch-control panel, the touch-control control unit 33 may control the first controllable switches T1 and the second controllable switches T2 to be simultaneously off and, later, the touch-control signal detection unit 32 may transit the reference signal to each touch-control emitting electrode.

Figure 9:
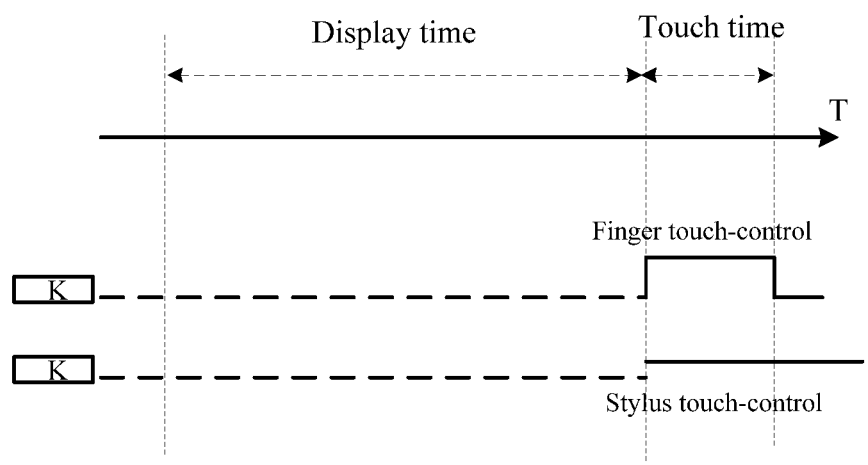
FIG. 9 illustrates an exemplary driving scheme of an exemplary touch-control display device driving method consistent with disclosed embodiments.

FIG. 9 illustrates a corresponding driving scheme. As shown in FIG. 9, the driving scheme of the touch-control display device may include a display time (display stage) and a touch time (touch stage), K represents signal on the touch-control control unit 33. During a touch stage, when in a first touch-control mode (i.e., finger touch-control mode), K is in a high voltage level, and the touch-control emitting electrodes in the same touch-control emitting electrode group may be electrically connected. Further, when in a second touch-control mode (i.e., stylus touch-control mode), K is in a low voltage level, and all touch-control emitting electrodes in the same touch-control emitting electrode group may be electrically segregated.

Figure 4:
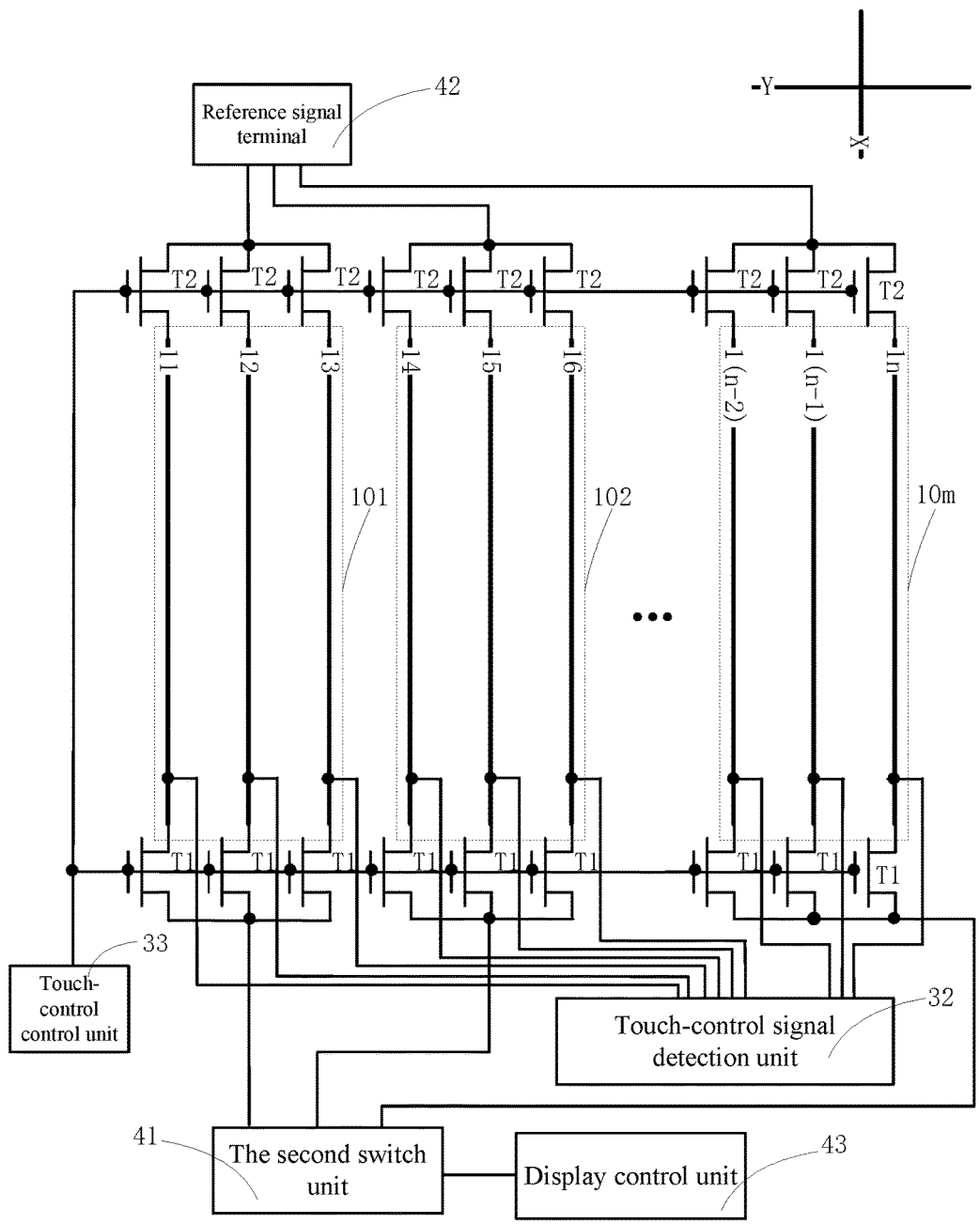
FIG. 4 illustrates another exemplary touch-control panel consistent with disclosed embodiments.

In one embodiment, the touch-control driving circuit may also include an independent circuit structure that maintains a voltage of the touch-control emitting electrode as the reference signal in the display mode. For example, FIG. 4 illustrates an exemplary touch-control panel. As shown in FIG. 4, the touch-control driving circuit may include a second switch unit 41, a reference signal terminal 42, and a display control unit 43.

In the display mode, the second switch unit 41 may, under the control of the display control unit 43, electrically connect the plurality of touch-control emitting electrode groups, from the first touch-control emitting electrode group 101 to the 'mth' touch-control emitting electrode group 10m, and connect paths between the reference signal terminal 42 and the touch-control emitting electrode groups. The first switch unit 31 may, under the control of the touch-control control unit 33, electrically connect all touch-control emitting electrodes in the same touch-control emitting electrode group.

The reference signal terminal 42 may, when in the display mode, output the reference signal to the plurality of touch-control emitting electrode groups, from the first touch-control emitting electrode group 101 to the 'mth' touch-control emitting electrode group 10m.

In the first touch-control mode and the second touch-control mode, the second switch unit 41 may, under the control of the display control unit 43, segregate the plurality of touch-control emitting electrode groups, from the first touch-control emitting electrode group 101 to the 'mth' touch-control emitting electrode group 10m, and cut off the paths between the reference signal terminal 42 and the disclosed touch-control emitting electrode groups.

In the display mode, the signal in the touch-control emitting electrodes may remain as the reference signal or the data signal. Further, the first switch unit 31 may, under the control of the touch-control control unit 33, electrically connect all touch-control emitting electrodes in the same touch-control emitting electrode group. That is, in the display mode, the touch-control control unit 33 may control the first controllable switches T1 and the second controllable switches T2 to be simultaneously on.

At the same time, the second switch unit 41 may, under the control of the display control unit 43, electrically connect all touch-control emitting electrode groups, and connect the paths between the reference signal terminal 42 and the touch-control emitting electrode groups. Further, the reference signal terminal 42 may output the reference signal to all touch-control emitting electrode groups to ensure that, in the display mode, each touch-control emitting electrode may still have the reference signal. Specifically, all touch-control emitting electrodes may be electrically connected to transit the reference signal, thus ensuring the stability of the signal in all touch-control emitting electrodes.

Further, in the first touch-control mode and the second touch-control mode, the connections between the reference signal terminal 42 and the touch-control emitting electrodes may be switched off. Accordingly, the second switch unit 41 may, under the control of the display control unit 43, segregate all touch-control emitting electrode groups, and cut off the paths between the reference signal terminal 42 and the touch-control emitting electrode groups. At this time, the first switch unit 31, the touch-control signal detection unit 32, and the touch-control control unit 33 may function using the operation methods consistent with disclosed embodiments.

Figure 5:
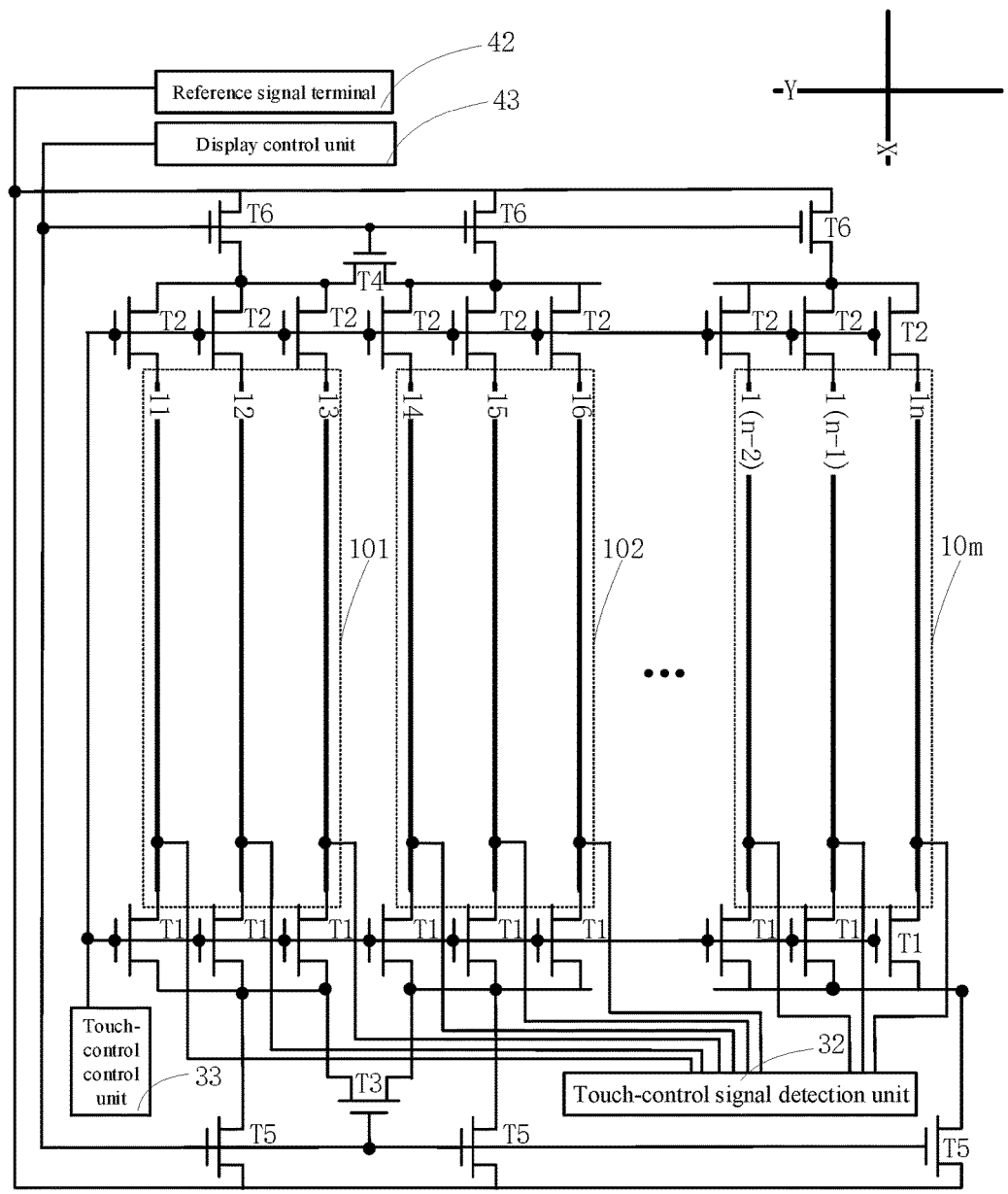
FIG. 5 illustrates an exemplary type of second switch unit consistent with disclosed embodiments.

FIG. 5 illustrates an exemplary type of second switch unit. As shown in FIG. 5, the second switch unit 41 may include a plurality of third controllable switches T3, a plurality of fourth controllable switches T4, a plurality of fifth controllable switches T5, and a plurality of sixth controllable switches T6.

The first ends of the first controllable switches T1 corresponding to two adjacent touch-control emitting electrode groups may be electrically connected with a first end and a second end of the third controllable switch T3, respectively. The second ends of the second controllable switches T2 corresponding to the two adjacent touch-control emitting electrode groups may be electrically connected with a first end and a second end of the fourth controllable switch T4, respectively.

The first ends of the first controllable switches T1 corresponding to any touch-control emitting electrode group may be electrically connected with a second end of the fifth controllable switch T5. The second ends of the second controllable switches T2 corresponding to any touch-control emitting electrode group may be electrically connected with a second end of the sixth controllable switch T6. First ends of the fifth controllable switches T5 and the sixth controllable switches T6 may electrically connected to the reference signal terminal 42. Control terminals of the third controllable switches T3, the fourth controllable switches T4, the fifth controllable switches T5, and the sixth controllable switches T6 may all electrically connected to the display control unit 43.

Specifically, in the display mode, the touch-control control unit 33 may control the first controllable switches T1 and the second controllable switches T2 to be simultaneously on, thus electrically connecting all the touch-control emitting electrodes in the same touch-control emitting electrode group. Simultaneously, the display control unit 43 may control the third controllable switches T3, the fourth controllable switches T4, the fifth controllable switches T5, and the sixth controllable switches T6 to be simultaneously on, and the adjacent touch-control emitting electrode groups may be electrically connected via the third controllable switch T3 and the fourth controllable switch T4.

The paths between the reference signal terminal 42 and the touch-control emitting electrode groups may be connected via the fifth controllable switches T5 and the sixth controllable switches T6. The reference signal outputted from the reference signal terminal 42 may first pass the fifth controllable switches T5 and the sixth controllable switches T6, and may continue to pass the first controllable switches T1 and the second controllable switches T2, respectively. Further, the reference signal may be transited to each touch-control emitting electrode to ensure that, in the display mode, the signal in the touch-control emitting electrodes may remain as the reference signal.

Further, in the first touch-control mode and the second touch-control mode, the display control unit 43 may control the third controllable switches T3, the fourth controllable switches T4, the fifth controllable switches T5 and the sixth controllable switches T6 to be simultaneously off to switch off the electrical connection between two adjacent touch-control emitting electrode groups. Simultaneously, the paths between the reference signal terminal 42 and the touch-control emitting electrode groups may also be cut off to ensure that, in the touch-control stage, the touch-control panel is not influenced by the reference signal.

The third controllable switches T3, the fourth controllable switches T4, the fifth controllable switches T5, and the sixth controllable switches T6 may all be thin film transistors (TFTs). The conduction types of the third controllable switches T3, the fourth controllable switches T4, the fifth controllable switches T5, and the sixth controllable switches T6 may be the same to reduce the number of output terminals of the display control unit 43, making it convenient to construct circuit lines. The third controllable switches T3, the fourth controllable switches T4, the fifth controllable switches T5 and the sixth controllable switches T6 may be transistors with different conduction types as long as in the display mode, the display control unit 43 controls T3, T4, T5 and T6 to be simultaneously on, and in the first touch-control mode and the second touch-control mode, the display control unit 43 controls T3, T4, T5 and T6 to be simultaneously off.

In the disclosed embodiments, different touch-control emitting electrodes may be connected with different touch-control signal detection terminals of the touch-control signal detection unit 32, resulting in an excessive number of touch-control signal detection terminals of the touch-control signal detection unit 32, not beneficial for the circuit construction.

Figure 10:
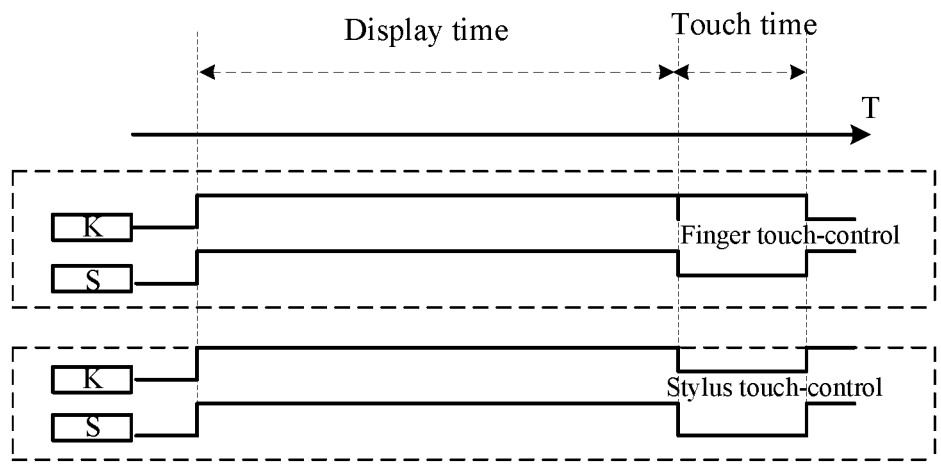
FIG. 10 illustrates another exemplary driving scheme of an exemplary touch-control display device driving method consistent with disclosed embodiments.

In one embodiment, FIG. 10 illustrates a corresponding driving scheme. As shown in FIG. 10, K is a signal provided on the touch-control control unit 33, and S is a signal provided on the display control unit 43. During the touch stage, when in the first touch-control mode (i.e., finger touch-control mode), K is at a high-voltage level and S is at a low voltage level. When in the second touch-control mode (i.e., stylus touch-control mode), K is at a low voltage level and S is also at a low voltage level.

Figure 6:
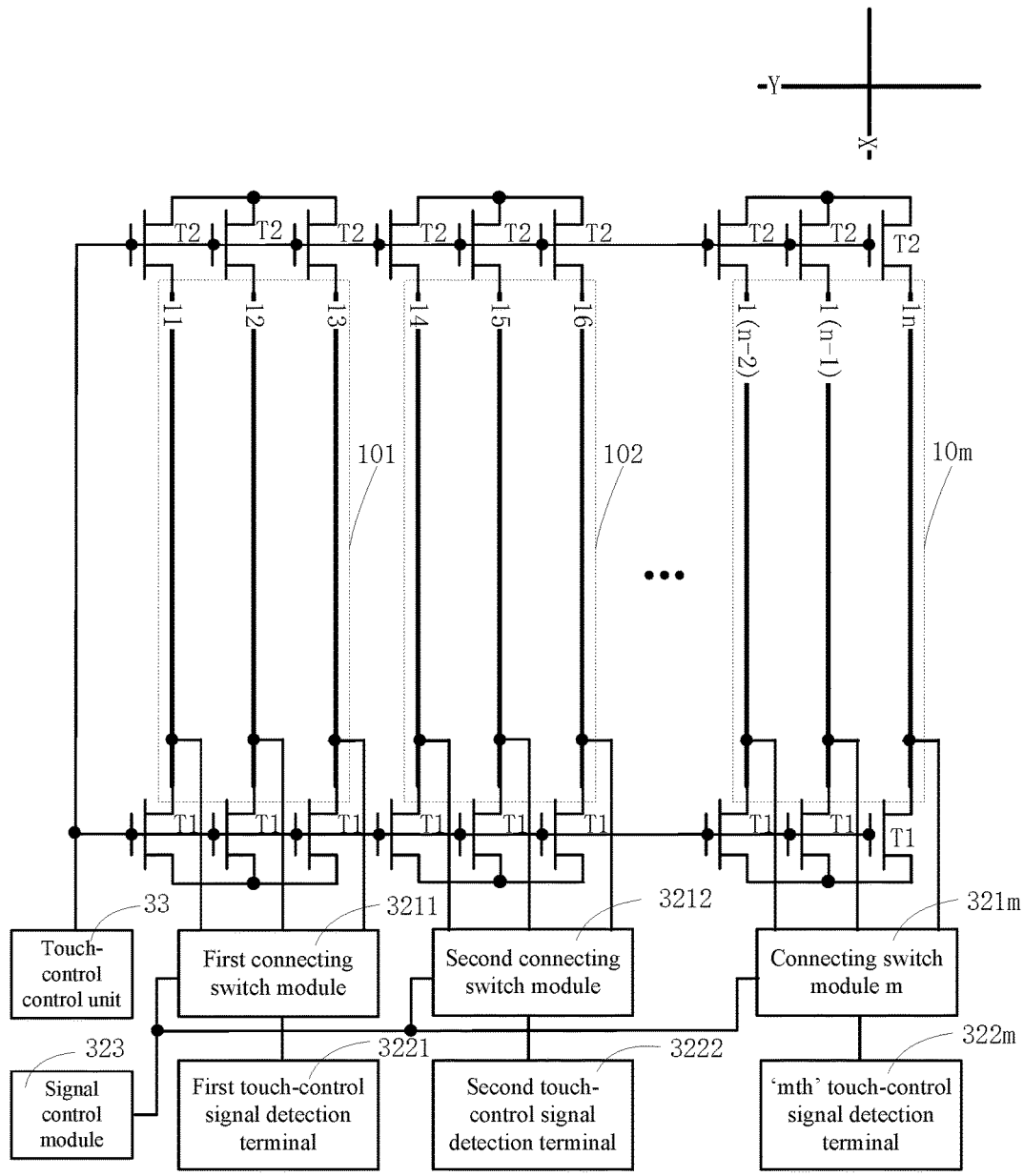
FIG. 6 illustrates an exemplary type of touch-control signal detection unit consistent with disclosed embodiments.

In one embodiment, FIG. 6 illustrates an exemplary type of touch-control signal detection unit. As shown in FIG. 6, a circuit of the touch-control signal detection unit 32 may be redesigned to connect the touch-control emitting electrodes in the same touch-control emitting electrode group with the touch-control signal detection terminal of the corresponding touch-control signal detection unit 32.

As shown in FIG. 6, the touch-control signal detection unit 32 may include a plurality of connection switch modules, from a first connection switch module 3211 to an 'mth' connection switch module 321m, a plurality of touch-control signal detection terminals, from a first touch-control signal detection terminal 3221 to an 'mth' touch-control signal detection terminal 322m, and a signal control module 323. A connection switch module i may be electrically connected with a touch-control signal detection terminal i and a touch-control emitting electrode group i, where i is a positive integer smaller than or equal to m.

Specifically, in both the first touch-control mode and the second touch-control mode, the plurality of touch-control signal detection terminals, from the first touch-control signal detection terminal 3221 to the 'mth' touch-control signal detection terminal 322m, may sequentially output the touch-control detection signal.

In the first touch-control mode, the plurality of connection switch modules, from the first connection switch module 3211 to the 'mth' connection switch module 321m, may connect each touch-control emitting electrode group with the corresponding touch-control signal detection terminal under the control of the signal control module 323.

In the second touch-control mode, each connection switch module with a corresponding touch-control signal detection terminal that outputs the touch-control detection signal may, under the control of the signal control module 323, sequentially connect corresponding touch-control emitting electrodes in the same touch-control emitting electrode group with the corresponding touch-control signal detection terminal.

Further, in the first touch-control mode, all touch-control emitting electrode groups may sequentially receive the touch-control detecting signal, and the first switch unit 31 may electrically connect all touch-control emitting electrodes in the same touch-control emitting electrode group. Accordingly, the signal control module 323 may control the connection switch module to connect at least one touch-control emitting electrode in the touch-control emitting electrode group with the corresponding touch-control signal detection terminal. That is, the signal control module 323 may connect the touch-control emitting electrode group with the corresponding touch-control signal detection terminal.

Simultaneously, the plurality of touch-control signal detection terminals, from the first touch-control signal detection terminal 3221 to the 'mth' touch-control signal detection terminal 322m, may sequentially output the touch-control detection signal. Accordingly, all touch-control emitting electrode groups may sequentially receive the touch-control detection signal.

In the second touch-control mode, all touch-control emitting electrodes may sequentially receive the touch-control detecting signal. Specifically, when the touch-control signal detection terminal outputs the touch-control detecting signal, the signal control module 323 may control the corresponding connection switch module to sequentially connect all corresponding touch-control emitting electrodes in the same touch-control emitting electrode group with the corresponding touch-control signal detection terminal. Accordingly, the plurality of touch-control emitting electrodes, from the first touch-control emitting electrode 11 to the 'nth' touch-control emitting electrode 1n, may sequentially receive the touch-control detecting signal.

Figure 7:
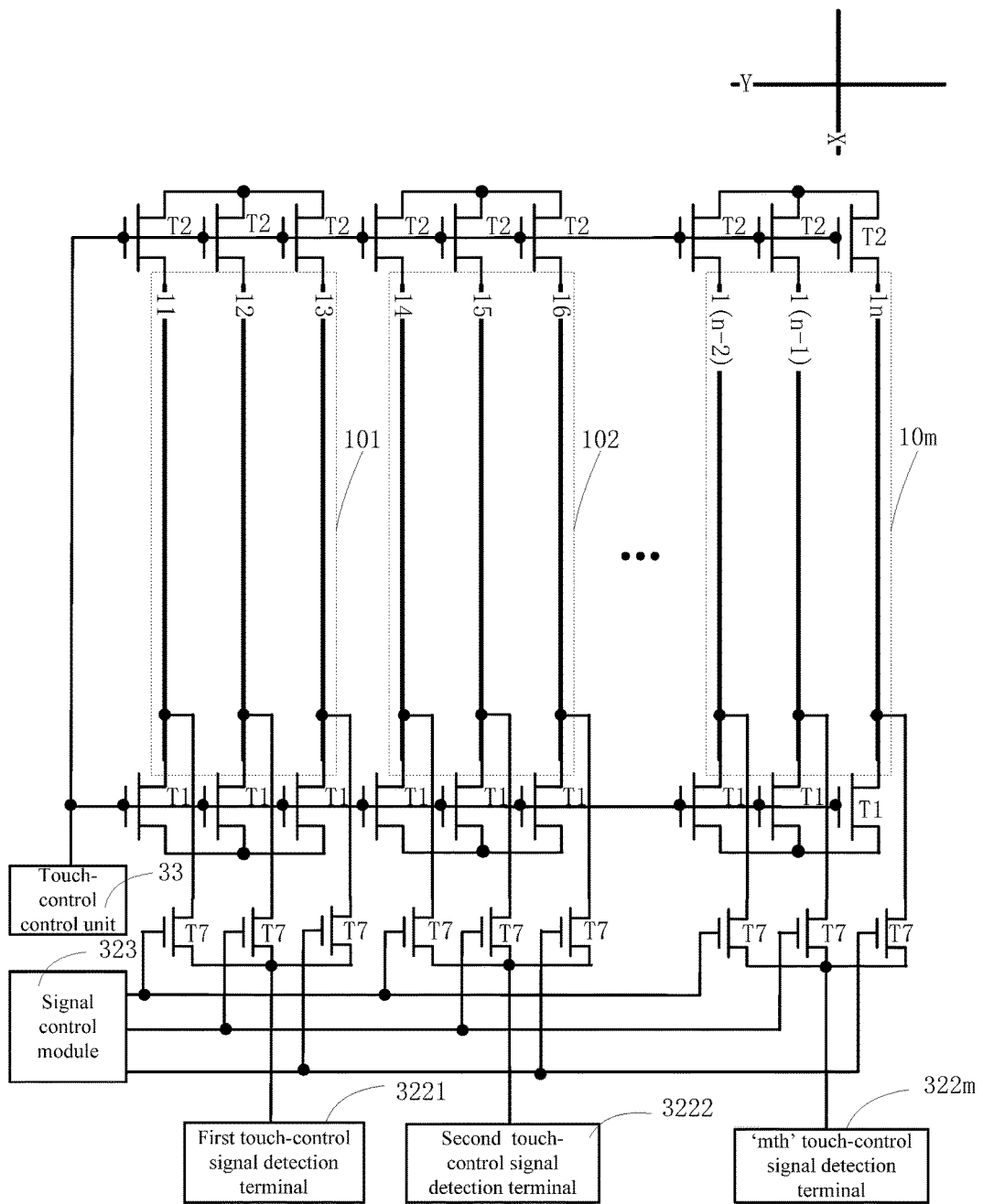
FIG. 7 illustrates another exemplary type of touch-control signal detection unit consistent with disclosed embodiments.

FIG. 7 illustrates an exemplary type of touch-control signal detection unit. As shown in FIG. 7, the connection switch module i may include a plurality of seventh controllable switches T7. First ends of the seventh controllable switches T7 may be electrically connected with the touch-control signal detection terminal i, and a second end of each seventh controllable switch T7 may be electrically connected with the first end of a corresponding touch-control emitting electrode in the touch-control emitting electrode group i.

In the first touch-control mode, the first switch unit 31 may electrically connect all touch-control emitting electrodes in the same touch-control emitting electrode group. Simultaneously, the signal control module 323 may switch on at least one seventh controllable switch T7 in correspondence to each touch-control emitting electrode group to electrically connect the touch-control signal terminal with the corresponding touch-control emitting electrode group. Further, the plurality of touch-control signal detection terminals, from the first touch-control signal detection terminal 3221 to the 'mth' touch-control signal detection terminal 322m, may sequentially output the touch-control detection signal. Accordingly, all touch-control emitting electrode groups may sequentially receive the touch-control detection signal.

In the second touch-control mode, the touch-control emitting electrodes may be segregated. The signal control module 323 may control all seventh controllable switches T7 in correspondence to the touch-control signal detection terminals that output the touch-control detection signal to be simultaneously on. Accordingly, all touch-control emitting electrodes in the same touch-control emitting electrode group may sequentially receive the touch-control detection signal. Further, the plurality of touch-control emitting electrodes, from the first touch-control emitting electrode to the 'nth' touch-control emitting electrode may sequentially receive the touch-control detection signal.

In the second touch-control mode, all seventh controllable switches T7 may not be simultaneously switched on, and the seventh controllable switches T7 in correspondence to the same touch-control emitting electrode group may not be all switched on. Accordingly, control terminals of the seventh controllable switches T7 in correspondence to the same touch-control emitting electrode group may be connected with different terminals of the signal control module 323.

The seventh controllable switches T7 may all be thin film transistors (TFTs), and all seventh controllable switches T7 may have the same conduction type. At this time, the control terminals of the seventh controllable switches T7 in correspondence to different touch-control emitting electrode groups but have the same arrangement order may be connect with the same terminal of the signal control module 323. For example, the seventh controllable switch T7 in correspondence to a touch-control emitting electrode q in the touch-control emitting electrode group i may be the same as the seventh controllable switch T7 in correspondence to a touch-control emitting electrode q in a touch-control emitting electrode group j, and j is a positive integer smaller than or equal to m.

Figure 11:
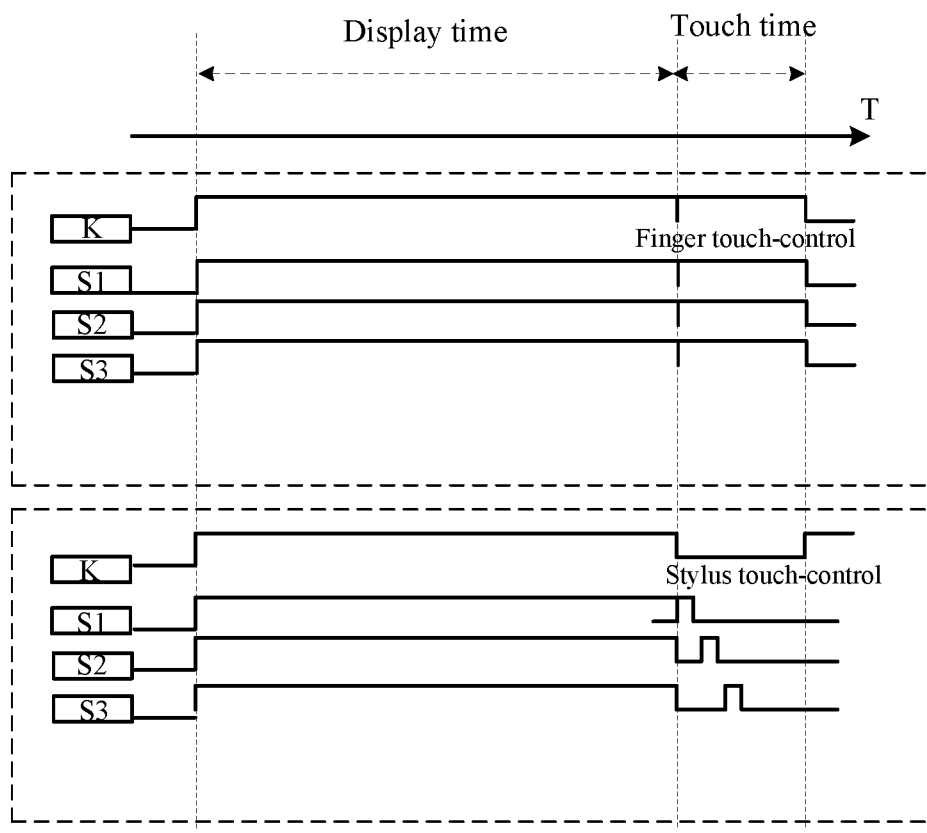
FIG. 11 illustrates another exemplary driving scheme of an exemplary touch-control display device driving method consistent with disclosed embodiments.

FIG. 11 illustrates a corresponding driving scheme. As shown in FIG. 11, K is a signal provided on the touch-control control unit 33, and S1, S2, and S3 are signals provided on the three lines of signal control module 323, respectively. During the touch stage, when in the first touch-control mode (i.e., finger touch-control mode), K is at a high voltage level and S1, S2, and S3 are also at a high voltage level. When in the second touch-control mode (i.e., stylus touch-control mode), K is at a low voltage level and S1, S2, and S3 are sequential pulse signals.

The first direction and the second direction may be perpendicular to each other. The first controllable switch, the second controllable switch, the third controllable switch, the fourth controllable switch, the fifth controllable switch, the six controllable switch and the seventh controllable switch may be P-type controllable switches or N-type controllable switches. Further, the conduction types of the first controllable switches, the second controllable switches, the third controllable switches, the fourth controllable switches, the fifth controllable switches, the six controllable switches and the seventh controllable switches may be the same such that a same fabrication process may be used.

The disclosed touch-control panel may be a liquid crystal touch-control panel, or may be an organic light-emitting touch-control panel. Specifically, the touch-control panel may include an array substrate, and the array substrate may include the plurality of touch-control emitting electrodes, from the first touch-control emitting electrode to the 'nth' touch-control emitting electrode. That is, the disclosed touch-control electrode may be fabricated in the array substrate.

Further, the disclosed embodiment may also include a first substrate arranged opposite to the array substrate. The touch-control sensing electrode may be disposed on the first substrate. When the touch-control panel is a liquid crystal touch-control panel, the first substrate may be a color film substrate.

Further, the disclosed array substrate may include a common electrode layer, and the plurality of touch-control emitting electrodes, from the first touch-control emitting electrode to the 'nth' touch-control emitting electrode, may be obtained by segmenting the common electrode layer. At this time, the reference signal may be the common electrode signal.

Figure 8:
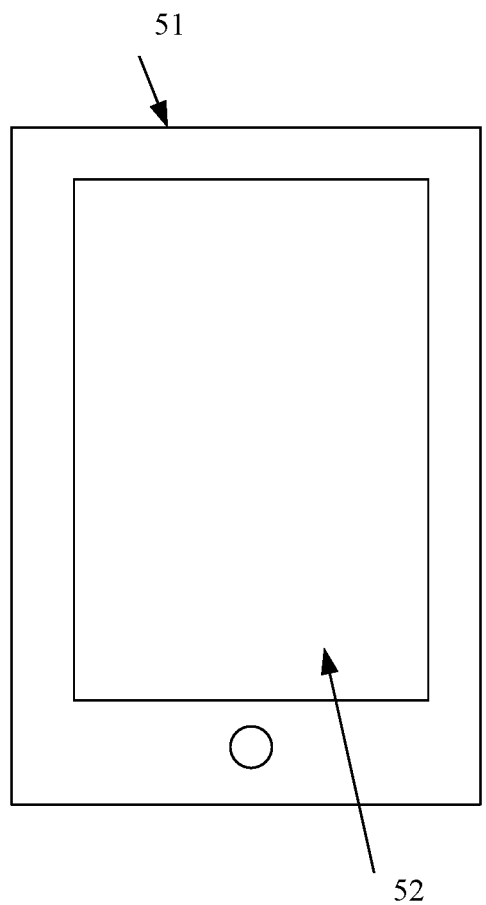
FIG. 8 illustrates an exemplary touch-control display device consistent with the disclosed embodiments.

The disclosed embodiment also provides a touch-control display device, and the touch-control display device may include a touch-control panel. FIG. 8 illustrates an exemplary display device consistent with the disclosed embodiments. As shown in FIG. 8, the display device 51 may be a tablet, a TV, a smartphone, a notebook, or a smart watch including any of the disclosed display panel 52.

Further, the disclosed touch-control display device may be a liquid crystal touch-control display device, or may be an organic light-emitting touch-control display device. The type of touch-control display device is only for illustrative purpose, and may not tend to limit the scope of the disclosed embodiments.

The disclosed touch-control panel and touch-control display device may include: a plurality of touch-control emitting electrodes arranged along a first direction, a plurality of touch-control receiving electrodes arranged along a second direction, and a touch-control driving circuit. The first direction and the second direction are perpendicular to each other.

Along the first direction, the plurality of touch-control emitting electrodes, from a first touch-control emitting electrode to an 'nth' touch-control emitting electrode, may be divided into a plurality of touch-control emitting groups, from a first touch-control emitting electrode group to an 'mth' touch-control emitting electrode group, and both n and m are integers larger than or equal to 2. That is, each touch-control emitting electrode group may include more than one touch-control emitting electrodes.

In a first touch-control mode, the touch-control driving circuit may electrically connect the plurality of touch-control emitting electrodes in a same touch-control emitting electrode group, and sequentially transit a touch-control detecting signal to the plurality of touch-control emitting electrode group, from the first touch-control emitting electrode group to the 'mth' touch-control emitting electrode group. In a second touch-control mode, the touch-control driving circuit may sequentially transit the touch-control detecting signal to the plurality of touch-control emitting electrodes, from the first touch-control emitting electrode to the 'nth' touch-control emitting electrode.

By using the disclosed touch-control panel and touch-control display device, a normal finger touch-control mode, namely, a first touch-control mode may be realized. In the first touch-control mode, the plurality of touch-control emitting electrodes, from the first touch-control emitting electrode to the 'mth' touch-control emitting electrode, may be divided into the plurality of touch-control emitting electrode groups, from the first touch-control emitting electrode group to the 'nth' touch-control emitting electrode. Further, all touch-control emitting electrodes in the same touch-control emitting electrode may be electrically connected, and the touch-control detecting signal may be sequentially transited to the plurality of touch-control emitting electrode groups, from the first touch-control emitting electrode group to the 'mth' touch-control emitting electrode group.

By using the disclosed touch-control panel and touch-control display device, a high-precision touch-control mode, namely, a second touch-control mode may be realized. In the second touch-control mode, the plurality of touch-control emitting electrodes, from the first touch-control emitting electrode to the 'nth' touch-control emitting electrode, may be mutually segregated. Further, the touch-control detecting signal may be sequentially transited to the plurality of touch-control emitting electrodes, from the first touch-control emitting electrode to the 'nth' touch-control emitting electrode. Accordingly, the touch-control modes in the touch-control display device may be increased to expand the application scope of the touch-control display devices.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A touch-control panel, comprising:
   a plurality of touch-control emitting electrodes, from a first touch-control emitting electrode to an n-th touch-control emitting electrode, arranged along a first direction and divided along the first direction into a plurality of touch-control emitting electrode groups, from a first touch-control emitting electrode group to an m-th touch-control emitting electrode group, wherein each touch-control emitting electrode group of the plurality of touch-control emitting electrode groups includes more than one touch-control emitting electrodes, and both n and m are integers larger than or equal to 2;
   a plurality of touch-control receiving electrodes arranged along a second direction, wherein the first direction and the second direction intersect with each other; and a touch-control driving circuit electrically connected with the plurality of touch-control emitting electrodes and configured to:
in a first touch-control mode, electrically connect all touch-control emitting electrodes in a same touch-control emitting electrode group, and sequentially transit a touch-control detecting signal to the plurality of touch-control emitting electrode groups, from the first touch-control emitting electrode group to the m-th touch-control emitting electrode group, wherein the each touch-control emitting electrode group is treated as a whole to detect a touch-control location together with the plurality of touch-control receiving electrodes based on mutual capacitance, and
in a second touch-control mode, sequentially transit the touch-control detecting signal to the plurality of touch-control emitting electrodes, from the first touch-control emitting electrode to the n-th touch-control emitting electrode, wherein each touch-control emitting electrode of the plurality of touch-control emitting electrodes individually cooperates with the plurality of touch-control receiving electrodes to detect the touch-control location based on mutual capacitance, wherein:
the touch-control driving circuit includes a touch-control signal detection unit, a touch-control control unit and a first switch unit including a plurality of first controllable switches and a plurality of second controllable switches,
each touch-control emitting electrode of the plurality of touch-control emitting electrodes corresponds to a respective one first controllable switch of the plurality of first controllable switches and a respective one second controllable switch of the plurality of second controllable switches,
a first end of the each touch-control emitting electrode is electrically connected to a second end of the respective one first controllable switch, and simultaneously connected to the touch-control signal detection unit through a connection node on the each touch-control emitting electrode, wherein the connection node is adjacent to the second end of the respective one first controllable switch,
a second end of the each touch-control emitting electrode is electrically connected to a first end of the respective one second controllable switch, and a control terminal of the respective one first controllable switch and a control terminal of the respective one second controllable switch are both electrically connected to the touch-control control unit, and
first ends of all first controllable switches of the plurality of first controllable switches corresponding to the each touch-control emitting electrode group of the plurality of touch-control emitting electrode groups are electrically connected, and second ends of all second controllable switches of the plurality of second controllable switches corresponding to the each touch-control emitting electrode group of the plurality of touch-control emitting electrode groups are electrically connected.

2. The touch-control panel according to claim 1, wherein:
when in the first touch-control mode, the first switch unit electrically connects all touch-control emitting electrodes in a same touch-control emitting electrode group under control of the touch-control control unit, and the touch-control signal detection unit sequentially transits the touch-control detecting signal to the plurality of touch-control emitting electrode groups, from the first touch-control emitting electrode group to the m-th touch-control emitting electrode group; and
when in the second touch-control mode, the first switch unit segregates all touch-control emitting electrodes in the same touch-control emitting electrode group from each other under the control of the touch-control control unit, and the touch-control driving circuit sequentially transits the touch-control detecting signal to the plurality of touch-control emitting electrodes, from the first touch-control emitting electrode to the n-th touch-control emitting electrode.

3. The touch-control panel according to claim 1, wherein:
the touch-control driving circuit includes a second switch unit, a reference signal terminal, and a display control unit;
when in a display mode, under control of the display control unit, the second switch unit is used to electrically connect the plurality of touch-control emitting electrode groups, from the first touch-control emitting electrode group to the m-th touch-control emitting electrode group, and to connect paths between the reference signal terminal and the plurality of touch-control emitting electrode groups; and
under control of the touch-control control unit, the first switch unit electrically connects all touch-control emitting electrodes in the each touch-control emitting electrode group of the plurality of touch-control emitting electrode groups;
when in the display mode, the reference signal terminal is used to output a reference signal to the plurality of touch-control emitting electrode groups, from the first touch-control emitting electrode group to the m-th touch-control emitting electrode group; and
when in the first touch-control mode or in the second touch-control mode, the second switch unit, under control of the display control unit, segregates the plurality of touch-control emitting electrode groups, from the first touch-control emitting electrode group to the m-th touch-control emitting electrode group, and cuts off the paths between the reference signal terminal and the plurality of touch-control emitting electrode groups.

4. The touch-control panel according to claim 3, wherein:
the second switch unit comprises a plurality of third controllable switches, a plurality of fourth controllable switches, a plurality of fifth controllable switches, and a plurality of sixth controllable switches;
first ends of two first controllable switches of the plurality of first controllable switches corresponding to two adjacent touch-control emitting electrode groups of the plurality of touch-control emitting electrode groups are electrically connected to a first end and a second end of a third controllable switch of the plurality of third controllable switches, respectively;
second ends of two second controllable switches of the plurality of second controllable switches corresponding to the two adjacent touch-control emitting electrode groups of the plurality of touch-control emitting electrode groups are electrically connected to a first end and a second end of a fourth controllable switch of the plurality of fourth controllable switches, respectively;
the first ends of the first controllable switch corresponding to the each touch-control emitting electrode group are electrically connected to a second end of a fifth controllable switch of the plurality of fifth controllable switches;
the second ends of the second controllable switch corresponding to the each touch-control emitting electrode group are electrically connected to a second end of a sixth controllable switch of the plurality of sixth controllable switches;

a first end of the fifth controllable switch and a first end of the sixth controllable switch are both electrically connected to the reference signal terminal; and control terminals of the third controllable switch, the fourth controllable switch, the fifth controllable switch, and the sixth controllable switch are electrically connected to the display control unit.

5. The touch-control panel according to claim 4, wherein:

the touch-control signal detection unit comprises a plurality of connection switch modules, from a first connection switch module to an m-th connection switch module, a plurality of touch-control signal detection terminals, from a first touch-control signal detection terminal to an m-th touch-control signal detection terminal, and a signal control module;

a connection switch module i is electrically connected to a touch-control signal detection terminal i and a touch-control emitting electrode group i, and i is a positive integer smaller than or equal to m;

the plurality of touch-control signal detection terminals are used to sequentially output a touch-control detection signal in the first touch-control mode and the second touch-control mode;

when in the first touch-control mode, each connection switch module of the plurality of connection switch modules connects a corresponding touch-control emitting electrode group of the plurality of touch-control emitting electrode groups with a corresponding touch-control signal detection terminal of the plurality of touch-control signal detection terminals;

when in the second touch-control mode, a connection switch module of the plurality of connection switch modules corresponding to a touch-control signal detection terminal of a currently outputted touch-control detection signal of the plurality of touch-control signal detection terminals, under control of the signal control module, sequentially connects all touch-control emitting electrodes in each corresponding touch-control emitting electrode group of the plurality of touch-control emitting electrode groups with the corresponding touch-control signal detection terminal of the plurality of touch-control signal detection terminals.

6. The touch-control panel according to claim 5, wherein:

the connection switch module i includes a plurality of seventh controllable switches;

a first end of each seventh controllable switch of the plurality of seventh controllable switches is electrically connected with the corresponding touch-control signal detection terminal of the plurality of touch-control signal detection terminals; and a second end of the each seventh controllable switch of the plurality of seventh controllable switches is electrically connected with a first end of a corresponding touch-control emitting electrode in the corresponding touch-control emitting electrode group of the plurality of touch-control emitting electrode groups.

7. The touch-control panel according to claim 6, wherein the plurality of first controllable switches, the plurality of second controllable switches, the plurality of third controllable switches, the plurality of fourth controllable switches, the plurality of fifth controllable switches, the plurality of sixth controllable switches and the plurality of seventh controllable switches are P-type controllable switches or N-type controllable switches.

8. The touch-control panel according to claim 7, wherein a connection type of the plurality of first controllable switches, the plurality of second controllable switches, the plurality of third controllable switches, the plurality of fourth controllable switches, the plurality of fifth controllable switches, the plurality of sixth controllable switches and the plurality of seventh controllable switches are a same connection type.

9. The touch-control panel according to claim 1, comprising:

an array substrate including the plurality of touch-control emitting electrodes, from the first touch-control emitting electrode to the n-th touch-control emitting electrode.

10. The touch-control panel according to claim 9, wherein the array substrate comprises a common electrode layer, and the plurality of touch-control emitting electrodes, from the first touch-control emitting electrode to the n-th touch-control emitting electrode, are obtained by segmenting the common electrode layer.

11. A touch-control display device, comprising a touch-control panel, wherein the touch-control panel comprises:

a plurality of touch-control emitting electrodes, from a first touch-control emitting electrode to an n-th touch-control emitting electrode, arranged along a first direction and divided along the first direction into a plurality of touch-control emitting electrode groups, from a first touch-control emitting electrode group to an m-th touch-control emitting electrode group, wherein each touch-control emitting electrode group of the plurality of touch-control emitting electrode groups includes more than one touch-control emitting electrodes, and both n and m are integers larger than or equal to 2;

a plurality of touch-control receiving electrodes arranged along a second direction, wherein the first direction and the second direction intersect with each other; and a touch-control driving circuit electrically connected with the plurality of touch-control emitting electrodes and configured to:

in a first touch-control mode, electrically connect all touch-control emitting electrodes in a same touch-control emitting electrode group, and sequentially transit a touch-control detecting signal to the plurality of touch-control emitting electrode groups, from the first touch-control emitting electrode group to the m-th touch-control emitting electrode group, wherein each touch-control emitting electrode group is treated as a whole to detect a touch-control location together with the plurality of touch-control receiving electrodes based on mutual capacitance, and in a second touch-control mode, sequentially transit the touch-control detecting signal to the plurality of touch-control emitting electrodes, from the first touch-control emitting electrode to the n-th touch-control emitting electrode, wherein each touch-control emitting electrode of the plurality of touch-control emitting electrodes individually cooperates with the plurality of touch-control receiving electrodes to detect the touch-control location based on mutual capacitance, wherein:

the touch-control driving circuit includes a touch-control signal detection unit, a touch-control control unit and a first switch unit including a plurality of first controllable switches and a plurality of second controllable switches, each touch-control emitting electrode of the plurality of touch-control emitting electrodes corresponds to a respective one first controllable switch of the plurality of first controllable switches and a respective one second controllable switch of the plurality of second controllable switches, a first end of the each touch-control emitting electrode is electrically connected to a second end of the respective one first controllable switch, and simultaneously connected to the touch-control signal detection unit through a connection node on the each touch-control emitting electrode, wherein the connection node is adjacent to the second end of the respective one first controllable switch, a second end of the each touch-control emitting electrode is electrically connected to a first end of the respective one second controllable switch, and a control terminal of the respective one first controllable switch and a control terminal of the respective one second controllable switch are both electrically connected to the touch-control control unit, and first ends of all first controllable switches of the plurality of first controllable switches corresponding to the each touch-control emitting electrode group of the plurality of touch-control emitting electrode groups are electrically connected, and second ends of all second controllable switches of the plurality of second controllable switches corresponding to the each touch-control emitting electrode group of the plurality of touch-control emitting electrode groups are electrically connected.

12. A touch-control panel, comprising:

a plurality of touch-control emitting electrodes, from a first touch-control emitting electrode to an n-th touch-control emitting electrode, arranged along a first direction and divided along the first direction into a plurality of touch-control emitting electrode groups, from a first touch-control emitting electrode group to an m-th touch-control emitting electrode group, wherein each touch-control emitting electrode group of the plurality of touch-control emitting electrode groups includes more than one touch-control emitting electrodes, and both n and m are integers larger than or equal to 2;

a plurality of touch-control receiving electrodes arranged along a second direction, wherein the first direction and the second direction intersect with each other; and a touch-control driving circuit electrically connected with the plurality of touch-control emitting electrodes and configured to:

in a first touch-control mode, electrically connect all touch-control emitting electrodes in a same touch-control emitting electrode group, and sequentially transit a touch-control detecting signal to the plurality of touch-control emitting electrode groups, from the first touch-control emitting electrode group to the m-th touch-control emitting electrode group, wherein the each touch-control emitting electrode group is treated as a whole to detect a touch-control location together with the plurality of touch-control receiving electrodes based on mutual capacitance, and in a second touch-control mode, sequentially transit the touch-control detecting signal to the plurality of touch-control emitting electrodes, from the first touch-control emitting electrode to the n-th touch-control emitting electrode, wherein each touch-control emitting electrode of the plurality of touch-control emitting electrodes individually cooperates with the plurality of touch-control receiving electrodes to detect the touch-control location based on mutual capacitance, wherein the touch-control driving circuit includes a first switch unit, a second switch unit, a touch-control signal detection unit, a touch-control control unit, a reference signal terminal and a display control unit, the first switch unit includes a plurality of first controllable switches and a plurality of second controllable switches, the second switch unit includes a plurality of third controllable switches, a plurality of fourth controllable switches, a plurality of fifth controllable switches, and a plurality of sixth controllable switches, first ends of two first controllable switches of the plurality of first controllable switches corresponding to two adjacent touch-control emitting electrode groups of the plurality of touch-control emitting electrode groups are electrically connected to a first end and a second end of a third controllable switch of the plurality of third controllable switches, respectively, second ends of two second controllable switches of the plurality of second controllable switches corresponding to the two adjacent touch-control emitting electrode groups of the plurality of touch-control emitting electrode groups are electrically connected to a first end and a second end of a fourth controllable switch of the plurality of fourth controllable switches, respectively, first ends of the first controllable switch corresponding to the each touch-control emitting electrode group are electrically connected to a second end of a fifth controllable switch of the plurality of fifth controllable switches, second ends of the second controllable switch corresponding to the each touch-control emitting electrode group are electrically connected to a second end of a sixth controllable switch of the plurality of sixth controllable switches, a first end of the fifth controllable switch and a first end of the sixth controllable switch are both electrically connected to the reference signal terminal, and control terminals of the third controllable switch, the fourth controllable switch, the fifth controllable switch, and the sixth controllable switch are electrically connected to the display control unit.

13. The touch-control panel according to claim 12, wherein:

each touch-control emitting electrode of the plurality of touch-control emitting electrodes corresponds to a respective one first controllable switch of the plurality of first controllable switches and a respective one second controllable switch of the plurality of second controllable switches, a first end of the each touch-control emitting electrode is electrically connected to a second end of the respective one first controllable switch, and simultaneously connected to the touch-control signal detection unit through a connection node on the each touch-control emitting electrode, wherein the connection node is adjacent to the second end of the respective one first controllable switch, a second end of the each touch-control emitting electrode is electrically connected to a first end of the respective one second controllable switch, and a control terminal of the respective one first controllable switch and a control terminal of the respective one second controllable switch are both electrically connected to the touch-control control unit, and first ends of all first controllable switches of the plurality of first controllable switches corresponding to the each touch-control emitting electrode group of the plurality of touch-control emitting electrode groups are electrically connected, and second ends of all second controllable switches of the plurality of second controllable switches corresponding to the each touch-control emitting electrode group of the plurality of touch-control emitting electrode groups are electrically connected.

14. The touch-control panel according to claim 12, wherein:
    when in the first touch-control mode, the first switch unit electrically connects all touch-control emitting electrodes in a same touch-control emitting electrode group under control of the touch-control control unit, and the touch-control signal detection unit sequentially transits the touch-control detecting signal to the plurality of touch-control emitting electrode groups, from the first touch-control emitting electrode group to the m-th touch-control emitting electrode group; and
    when in the second touch-control mode, the first switch unit segregates all touch-control emitting electrodes in the same touch-control emitting electrode group from each other under the control of the touch-control control unit, and the touch-control driving circuit sequentially transits the touch-control detecting signal to the plurality of touch-control emitting electrodes, from the first touch-control emitting electrode to the n-th touch-control emitting electrode.

15. The touch-control panel according to claim 12, wherein:
    when in a display mode, under control of the display control unit, the second switch unit is used to electrically connect the plurality of touch-control emitting electrode groups, from the first touch-control emitting electrode group to the m-th touch-control emitting electrode group, and to connect paths between the reference signal terminal and the plurality of touch-control emitting electrode groups; and
    under control of the touch-control control unit, the first switch unit electrically connects all touch-control emitting electrodes in the each touch-control emitting electrode group of the plurality of touch-control emitting electrode groups;
    when in the display mode, the reference signal terminal is used to output a reference signal to the plurality of touch-control emitting electrode groups, from the first touch-control emitting electrode group to the m-th touch-control emitting electrode group; and
    when in the first touch-control mode or in the second touch-control mode, the second switch unit, under control of the display control unit, segregates the plurality of touch-control emitting electrode groups, from the first touch-control emitting electrode group to the m-th touch-control emitting electrode group, and cuts off the paths between the reference signal terminal and the plurality of touch-control emitting electrode groups.

16. The touch-control panel according to claim 12, wherein:
    the touch-control signal detection unit comprises a plurality of connection switch modules, from a first connection switch module to an m-th connection switch module, a plurality of touch-control signal detection terminals, from a first touch-control signal detection terminal to an m-th touch-control signal detection terminal, and a signal control module;
    a connection switch module i is electrically connected to a touch-control signal detection terminal i and a touch-control emitting electrode group i, and i is a positive integer smaller than or equal to m;
    the plurality of touch-control signal detection terminals are used to sequentially output a touch-control detection signal in the first touch-control mode and the second touch-control mode;
    when in the first touch-control mode, each connection switch module of the plurality of connection switch modules connects a corresponding touch-control emitting electrode group of the plurality of touch-control emitting electrode groups with a corresponding touch-control signal detection terminal of the plurality of touch-control signal detection terminals;
    when in the second touch-control mode, a connection switch module of the plurality of connection switch modules corresponding to a touch-control signal detection terminal of a currently outputted touch-control detection signal of the plurality of touch-control signal detection terminals, under control of the signal control module, sequentially connects all touch-control emitting electrodes in each corresponding touch-control emitting electrode group of the plurality of touch-control emitting electrode groups with the corresponding touch-control signal detection terminal of the plurality of touch-control signal detection terminals.

* * * * *